(12) United States Patent
Eckhardt et al.

(10) Patent No.: US 8,149,035 B2
(45) Date of Patent: Apr. 3, 2012

(54) MULTI-OUTPUT PLL OUTPUT SHIFT

(75) Inventors: James Eckhardt, Poughkeepsie, NY (US); Shiu Chung Ho, Essex Junction, VT (US); Paul D. Muench, Poughkeepsie, NY (US); Scot H. Rider, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/698,258

(22) Filed: Feb. 2, 2010

(65) Prior Publication Data

US 2011/0187423 A1 Aug. 4, 2011

(51) Int. Cl.
*H03L 7/06* (2006.01)
(52) U.S. Cl. ............... 327/159; 327/156; 327/150
(58) Field of Classification Search ............ 327/156, 327/159
See application file for complete search history.

(56) References Cited

U.S. PATENT DOCUMENTS

| | | | |
|---|---|---|---|
| 5,124,669 A | 6/1992 | Palmer et al. | |
| 5,721,514 A * | 2/1998 | Crockett et al. | 331/3 |
| 6,011,732 A | 1/2000 | Harrison et al. | |
| 6,150,891 A | 11/2000 | Welland et al. | |
| 6,289,067 B1 * | 9/2001 | Nguyen et al. | 375/372 |
| 6,441,661 B1 | 8/2002 | Aoki et al. | |
| 7,209,008 B2 * | 4/2007 | Opris | 331/12 |
| 7,339,861 B2 | 3/2008 | Minamino et al. | |
| 7,675,328 B2 * | 3/2010 | Cheung | 327/3 |
| 2009/0128201 A1 * | 5/2009 | Chen et al. | 327/149 |
| 2009/0140773 A1 * | 6/2009 | Cheung | 327/3 |
| 2010/0007389 A1 * | 1/2010 | Li et al. | 327/153 |

FOREIGN PATENT DOCUMENTS

| | | |
|---|---|---|
| JP | 55140178 | 11/1980 |
| JP | 06152321 | 5/1994 |
| JP | 2001060868 A | 3/2001 |

OTHER PUBLICATIONS

Victor Arana et al., Nonlinear Synthesis of Phase Shifters, Based on Synchronized Oscillators, IEEE Microwave and Wireless Components Letters, vol. 15, No. 11, Nov. 2005.

* cited by examiner

*Primary Examiner* — Ryan Jager
(74) *Attorney, Agent, or Firm* — Cantor Colburn LLP; William A. Kinnaman, Jr.

(57) ABSTRACT

Controlling a PLL includes providing a voltage controlled oscillator (VCO) and coupling an output of the VCO to a shifter circuit. The shifter circuit has a shifter circuit output, the shifter circuit also including an activation input for receiving an activation signal, the shifter circuit causing at least one pulse of the output signal to be suppressed at the shifter output upon receipt of the activation signal. Controlling also includes coupling the shifter circuit output to a first frequency divider.

8 Claims, 3 Drawing Sheets

MULTI-OUTPUT PLL OUTPUT SHIFT

BACKGROUND

The present invention relates to generating reference pulse trains and, more specifically, to being able to control shifting outputs of a multi-output phase locked loop (PLL) via an external control.

A phase-locked loop or phase lock loop (PLL) is a control system that generates a signal that has a fixed relation to the phase of a "reference" signal. A phase-locked loop circuit responds to both the frequency and the phase of the input signals, automatically raising or lowering the frequency of a controlled oscillator until it is matched to the reference in both frequency and phase. A phase-locked loop is an example of a control system using negative feedback.

In a typical PLL, a phase detector compares two input signals and produces an error signal that is proportional to their phase difference. The error signal is then low-pass filtered and used to drive a voltage-controlled oscillator (VCO) that creates an output signal having an output frequency. The output signal is fed through a frequency divider back to the input of the system, producing a negative feedback loop. If the output frequency drifts, the error signal will increase, driving the VCO frequency in the opposite direction so as to reduce the error. Thus, the output is locked to the frequency at the other input. This input is called the reference input and is often derived from a crystal oscillator, which is very stable in frequency.

A frequency (or clock) divider is an electronic circuit that takes an input signal with an input frequency and generates an output signal with a frequency that is a fraction of the input frequency. PLLs make use of frequency dividers to generate multiple outputs having frequencies that are multiples of the input frequency.

SUMMARY

According to one embodiment of the present invention, a phase locked loop (PLL) having two or more outputs is provided. The PLL of this embodiment includes a voltage controller oscillator (VCO) that outputs an output signal having a first frequency at an output terminal and a first frequency divider electrically coupled to the output terminal creating a first divided output signal having a first divided output frequency. The PLL of this embodiment also includes a shifter circuit having a shifter circuit input electrically coupled to the output terminal and a shifter circuit output, the shifter circuit also including an activation input that receives an activation signal, the shifter circuit causing at least one pulse of the output signal to be suppressed at the shifter output upon receipt of the activation signal. The PLL also includes a second frequency divider electrically coupled to the shifter circuit output creating a second divided output signal based on the shifter circuit output and having a second divided output frequency.

Another embodiment of the present invention is directed to a method of operating a phase locked loop (PLL) having multiple outputs and a voltage controller oscillator (VCO) having a VCO period. The method of this embodiment includes: creating a first internal clock signal; creating a second internal clock signal; providing the first internal clock signal as an input to a first frequency divider; providing the second internal clock signal as an input to the second frequency divider; and upon receipt of an activation signal, causing at least one peak of the second internal clock signal to be suppressed.

Another embodiment of the present invention is directed to a method. The method includes: providing a voltage controlled oscillator (VCO); coupling an output of the VCO to a shifter circuit, the shifter circuit having a shifter circuit output, the shifter circuit also including an activation input for receiving an activation signal, the shifter circuit causing at least one pulse of the output signal to be suppressed at the shifter output upon receipt of the activation signal; and coupling the shifter circuit output to a first frequency divider.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

When a PLL with a plurality of outputs starts generating a valid locked signal, there is no control as to what phase relationship the outputs will have to each other. For example, if one output of PLL is desired to run at 2 Mhz and another to run at 3 Mhz, the divided outputs will, at some point in time, have coincident rising edges. It has been discovered that, for certain applications, it may be necessary to control where, relative to an external event, the outputs of the PLL are coincidentally rising (or falling). PLL's currently do not provide a way to do this.

In other words, for certain applications, it may be necessary for two outputs with counts M and N, respectively, of fundamental frequency, f, to be in phase (both counts=0) coincident with an externally provided stimulus. For example, a PLL may be locked and running in a system where one output is controlling a communications link and the other output is controlling a memory or storage device, and upon detection of a type of control packet, and instruction may be decoded indicating that the alignment point where the two clocks are currently coincident is not correct, and one of the outputs should phase shift to create a new alignment point relative to where it originally was. This correction should be done to the output of the PLL that is not controlling the detection of the control packet.

Figure 1:
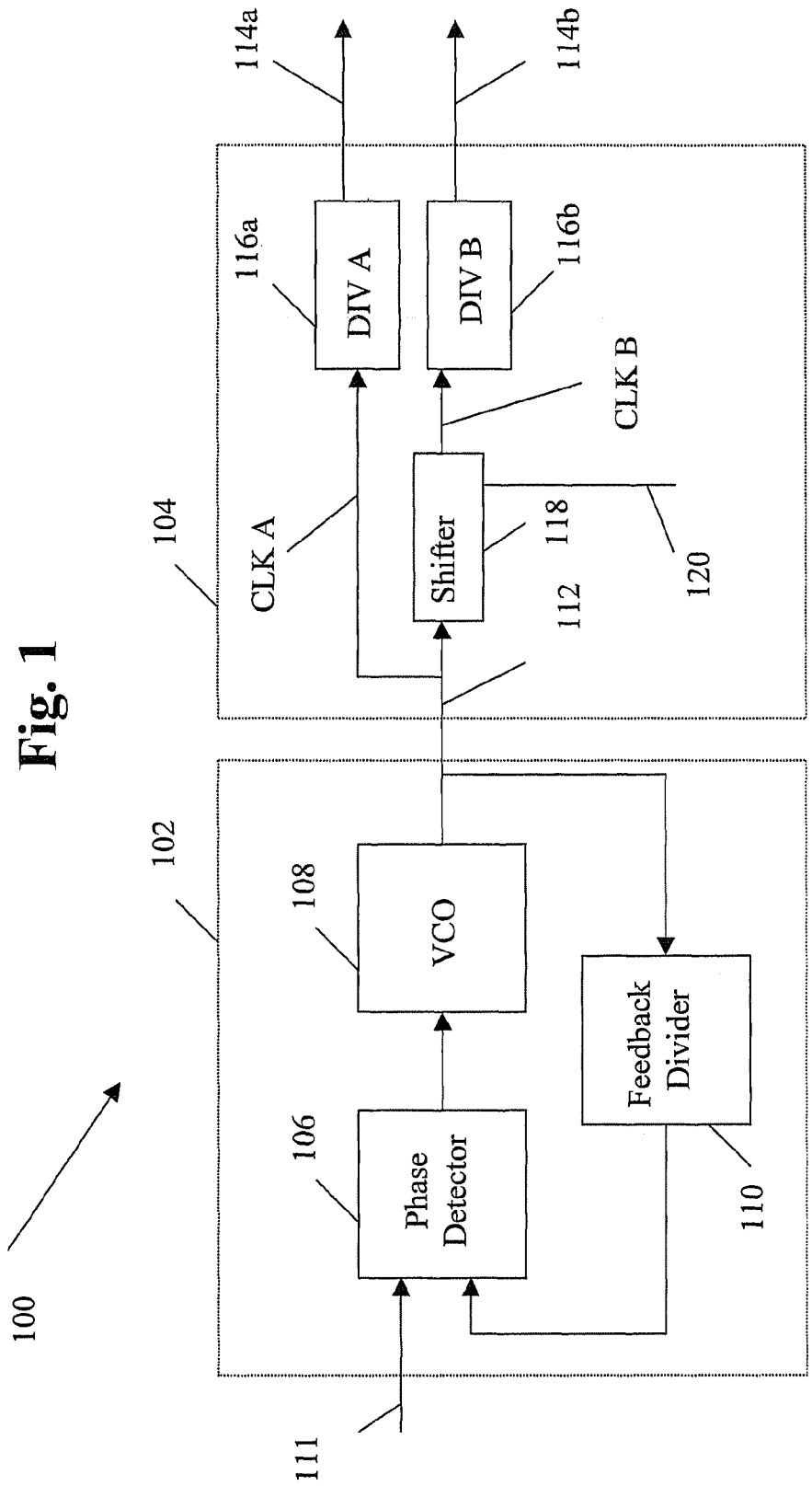
FIG. 1 shows a circuit diagram of a PLL according to one embodiment.

FIG. 1 shows a circuit diagram of a PLL 100 according to one embodiment of the present invention. The PLL 100 includes a reference clock portion 102 and a clock divider portion 104.

The reference clock portion receives an input signal 111 and produces an output signal 112. A phase detector 106 compares the input signal to a modified version of the output signal 112 and produces an error signal that is proportional to their phase difference. The error signal may them optionally be low-pass filtered and used to drive a voltage-controlled oscillator (VCO) 108 that creates output signal 112. Output signal 112 has a reference output frequency. The output signal 112 is fed through a frequency divider 110 back to the phase detector 106, producing a negative feedback loop. If the output frequency drifts, the error signal will increase, driving the VCO 108 frequency in the opposite direction so as to reduce the error. Thus, the output signal 112 (output of the VCO 108) is locked to the frequency of the input signal 111.

In many instances, the PLL 100 may need to provide one more outputs that have a difference frequency than the output signal 112. To that end, the PLL 100 may also include clock divider portion 102. The clock divider portion 102 receives as in input, the output signal 112. From this, the clock divider portion 102 produces one or more divided outputs 114. As shown, there are two divided outputs 114 (114a and 114b). Of course, this is not meant to be limiting and the number of divided outputs 114 may be any number. In one embodiment, the first divided output 114a may have a frequency ½ the frequency of the output signal 100 and the second divided output 114b may have a frequency ⅓ the frequency of the output signal 112.

In one embodiment, the output signal 112 is coupled to one or more frequency (or clock) dividers 116. The frequency dividers 116 receive the output signal 112 and produce divided outputs 114. As shown, a first frequency divider 116a produces the first divided output 114a and the second frequency divider 116b produces the second divided output 114b. As discussed above, number of divider outputs 114 is not limited. Likewise, the number of frequency dividers 116 is not limited to the two (116a and 116b) shown in FIG. 1 and more could be included if more divided outputs 114 are desired. Of course, the frequency dividers 116 could be implemented as a single unit having multiple outputs in one embodiment.

In one embodiment, the frequency dividers may be implemented as counters that have a preset value. When the preset value is reached, the divided output transitions from a first value to a second value. Following that, the counter is reset and when the preset value is again reached, the divided output transitions from the second value to the first value. It will be understood stood, that the preset value may be integer and represents the amount that the frequency divider 116 divides the frequency of output signal 112 to create the divided output 114.

In one embodiment, one or more of the frequency dividers 116 may have a shifter circuit 118 disposed between its input and the output of the VCO 108. As shown, the shifter circuit 118 is coupled between output of the VCO 108 and the second frequency divider 116b. This is by way of example and explanation only and other configurations are within the scope of the present invention as long as one shifter circuit is coupled in a manner that allows for it to cause one divided output signal 114 to be varied.

The shifter circuit 118, in one embodiment, causes one pulse of the output signal 112 to be disallowed to propagate to the frequency divider 116b to which it is coupled. This results in shifting (delaying) the divided output 114 one VCO period.

For ease of explanation, in FIG. 1 the input to the first frequency divider 116a is shown as CLK A and the output of the shifter circuit 118 (input to the second frequency divider 116b) is shown as CLK B.

The shifter circuit 118 may receive an activation input 120 that causes the shifter circuit to become activated for one pulse of the output signal 112. Each time the shifter circuit 118 is activated, it may cause a pulse of the output signal 112 to be suppressed and not passed to a frequency divider 116 to which it is attached. Accordingly, upon receipt of a signal at the activation input 120, the shifter circuit 118 causes CLK B to "miss" a pulse.

The activation input 120 may be received from any source. In one embodiment, the activation input 120 is received from when a particular external condition has been detected.

Figure 2A:
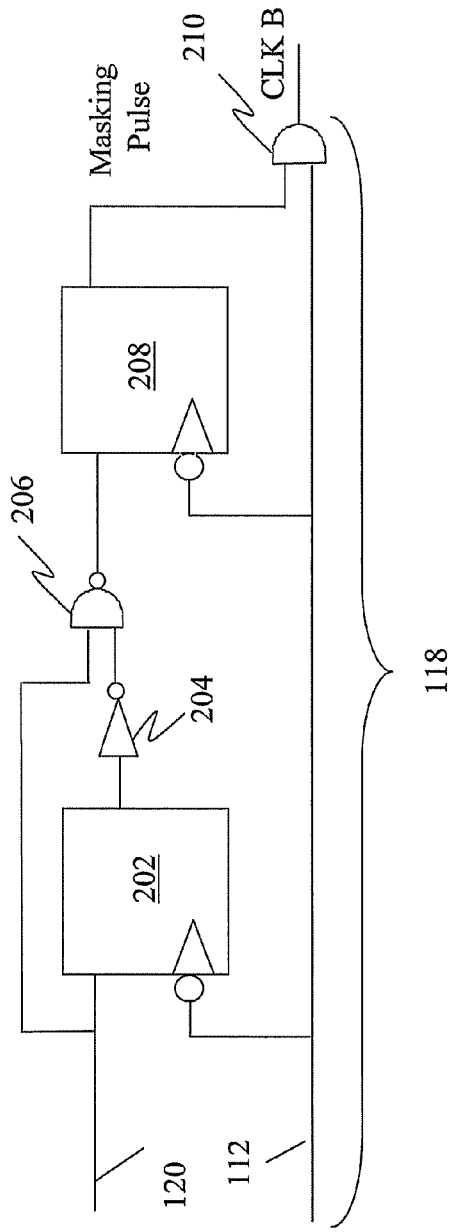
FIGS. 2a and 2b show two embodiments of a shifter circuit according to the present invention.
Figure 2B:
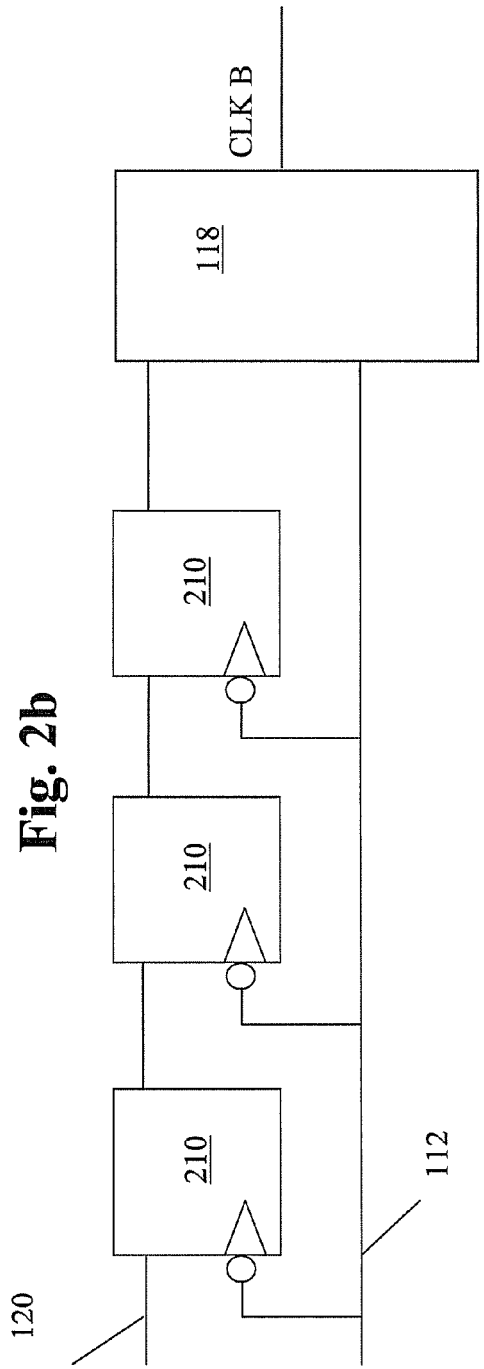

FIGS. 2a and 2b show two embodiments a shifter circuit 118 according to the present invention. Of course, these embodiments are present by way of example only and not intended to limit how a shifter circuit 118 may be implemented. The shifter circuit 118 shown in FIG. 2a includes may be referred to herein as a masking pulse generator. The masking pulse generator 118 receives the activation input signal 120 and the output signal 112 and produces an output of CLK B. In FIGS. 2a and 2b flip-flops are shown. One of ordinary skill in the art will realize that the flip-flops could be replaces by latches or other devices used to detect an edge (e.g., latches) and may, in some embodiments, be omitted.

In FIG. 2a the masking pulse generator 118 may include a first D flip-flop 202 that is receives the activation input signal 120 as an input and is clocked by the output signal 112. The output of the first D flip-flop 202 may be coupled to an inverter 204. The output of the inverter 204 and the activation input signal 120 are coupled to a NAND gate 206. The assembly of the first D flip-flop 202, the inverter 204 and the NAND gate 206 form an edge detector when connected as shown in FIG. 2a. Such a detector may detect when the activation signal changes from a first value to a second value or from the second value to the first value.

The output of the NAND gate 206 may be coupled to the input of a second D flip-flop 208 what is clock by the output signal 112. This second D flip-flop 208 stabilizes and holds the output of the NAND 206 for at least one period of the output signal 112. The output of the second D flip-flop 208 may be referred to herein as a masking pulse. The masking pulse and the output signal 112 are coupled to the input of AND gate 210.

As one of skill in the art will realize, the masking pulse serves to block one rising edge of CLK B. Suppression of this rising edge results in a delay, by one period of the VCO, of an output of a frequency divider 116 (e.g., divided output 114b) coupled to the shifter circuit 118 (FIG. 1).

FIG. 2b shows an alternative embodiment in which the masking pulse generator 118 includes signal conditioning elements coupled thereto. In this embodiment, the activation input signal 120 is passed through one or more (three are shown but this is not limiting) signal conditioners 210. The signal conditioners 210 may remove metastability from the activation input signal 210 and/or synchronize the activation input signal 210 to the output signal 112. In one embodiment, the signal conditioners 210 are formed as D flip-flops having the activation input signal 210 (or the output of a preceding signal conditioner) as an input and being clocked by the output signal 112. The output of the last signal conditioner in the chain is provided as an input to the masking pulse generator 118.

It shall be understood, that signals that are not shifted (e.g., CLK A in FIG. 1) may be coupled to a configuration as shown generally in FIG. 2b to ensure that each signal is coupled to a same or similar load. In such a case, the connection shown in FIG. 2a between the second D flip-flop 208 and the AND gate 210 may be severed. In such a configuration, both CLK A and CLK B may be output from the shifter circuit 118 with only one or the other being shifted.

Figure 3:
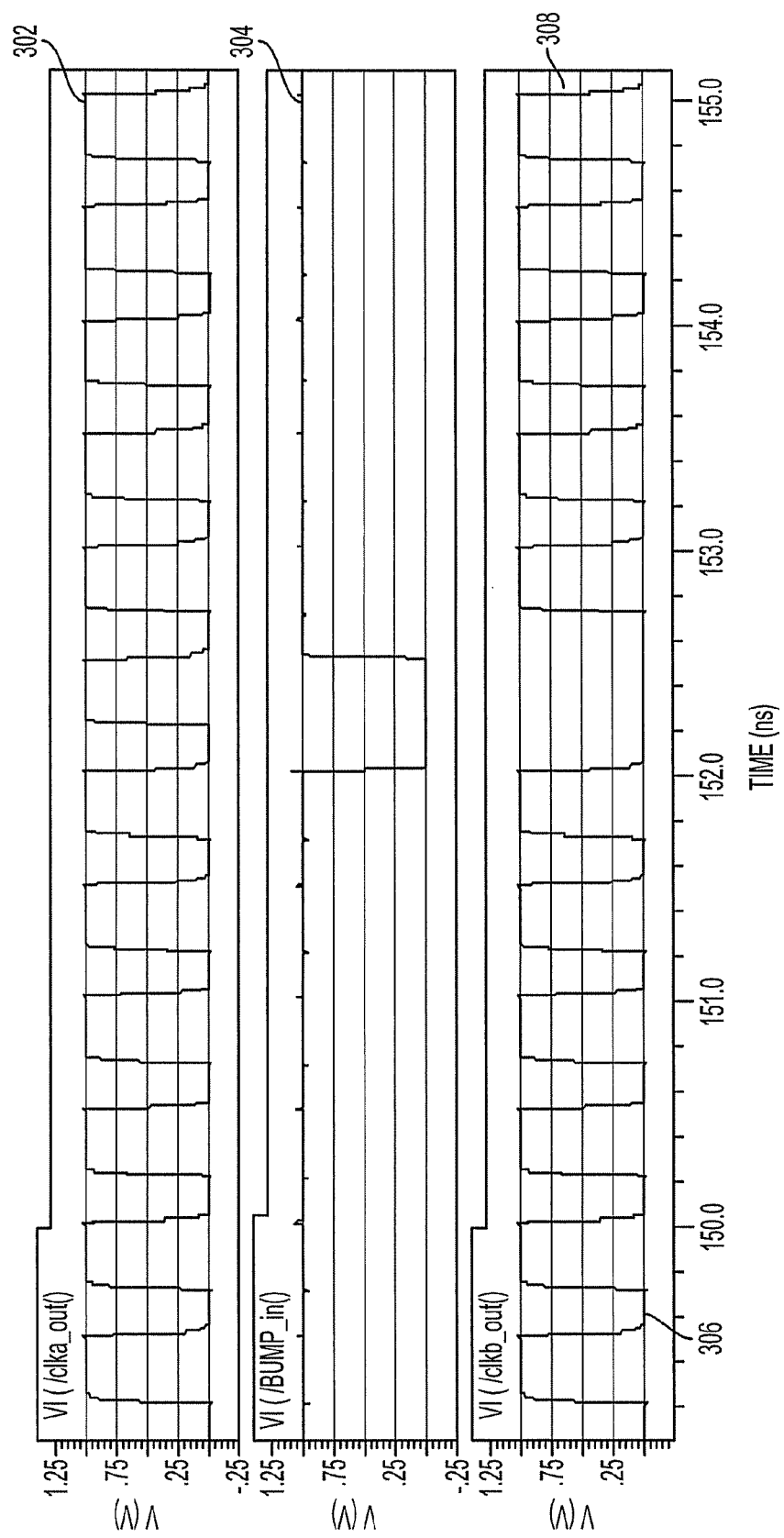
FIG. 3 shows graphs of signals that may be produced in the PLL shown in FIG. 1.

FIG. 3 shows a comparison of three signals that may exist in FIG. 1. The first signal 302 is an example of output signal 112/CLK A. This signal is operating at a first frequency. The second signal 304 is an example of the masking pulse output by the second D flip-flop 208 of FIG. 2a. This signal, when operating as on input to an AND gate (the other input being output signal 112 or some variation thereof), produces the third signal 306. The third signal 306 may be CLK B in FIG. 1. The third signal has a the same or similar frequency as the first signal 302. However, at least one peak is suppressed in the region 308 due to the masking pulse 304. The suppression of the peak will cause the counter of the frequency divider to miss a count and, therefore, delay the output of that divider by one VCO (FIG. 1) cycle.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one ore more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A phase locked loop (PLL) having two or more outputs, the PLL comprising:
    a voltage controller oscillator (VCO) that outputs an output signal having a first frequency at an output terminal;
    a first frequency divider electrically coupled to the output terminal creating a first divided output signal having a first divided output frequency;
    a shifter circuit having a shifter circuit input electrically coupled to the output terminal and a shifter circuit output, the shifter circuit also including an activation input that receives an activation signal, the shifter circuit causing at least one pulse of the output signal to be suppressed at the shifter output upon receipt of the activation signal; and
    a second frequency divider electrically coupled to the shifter circuit output creating a second divided output signal based on the shifter circuit output and having a second divided output frequency;
    wherein the first divided output frequency is less than the first frequency and greater than or equal to the second divided output frequency.

2. The PLL of claim 1, wherein, after the activation signal has been received, the second divided output is delayed by one period of the first frequency.

3. The PLL of claim 1, wherein the second divided output signal is delayed by one VCO period relative to the first divided output signal.

4. The PLL of claim 1, wherein the second divided output signal is delayed by two VCO periods relative to the first divided output signal.

5. A phase locked loop (PLL) having two or more outputs, the PLL comprising:
    a voltage controller oscillator (VCO) that outputs an output signal having a first frequency at an output terminal;
    a first frequency divider electrically coupled to the output terminal creating a first divided output signal having a first divided output frequency;
    a shifter circuit having a shifter circuit input electrically coupled to the output terminal and a shifter circuit output, the shifter circuit also including an activation input that receives an activation signal, the shifter circuit causing at least one pulse of the output signal to be suppressed at the shifter output upon receipt of the activation signal; and
    a second frequency divider electrically coupled to the shifter circuit output creating a second divided output signal based on the shifter circuit output and having a second divided output frequency;
    wherein the shifter circuit includes:
    a first D flip-flop having an input coupled to the activation signal and a first D flip-flop output, the first D flip-flop having a clock input coupled to the output signal;
    a first inverter having an input coupled to the first D flip-flop output and an output; and
    a logic gate having inputs coupled to the output of the inverter and the activation signal and an output.

6. The PLL of claim 5, wherein the shifter circuit further includes:
    a second D flip-flop having an input electrically coupled to the output of the logic gate and a second D flip-flop output, the first D flip-flop having a clock input coupled to the output signal.

7. The PLL of claim 6, wherein logic gate is a NAND gate.

8. The PLL of claim 6, further including:
    an output logic gate coupled to the second D flip-flop output and the output signal.

* * * * *